(12) United States Patent
Wang

(10) Patent No.: US 8,589,963 B2
(45) Date of Patent: Nov. 19, 2013

(54) ELECTRONIC DEVICE

(75) Inventor: Yuan-Ming Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/596,111

(22) Filed: Aug. 28, 2012

(65) Prior Publication Data

US 2013/0169135 A1 Jul. 4, 2013

(30) Foreign Application Priority Data

Dec. 28, 2011 (CN) .......................... 2011 1 0446808

(51) Int. Cl.
*G11B 33/02* (2006.01)
(52) U.S. Cl.
USPC .......................................................... 720/647
(58) Field of Classification Search
USPC .......................................................... 720/647
See application file for complete search history.

(56) References Cited

U.S. PATENT DOCUMENTS

| | | | |
|---|---|---|---|
| 7,363,635 B2 * | 4/2008 | Hibi | 720/647 |
| 7,458,085 B2 * | 11/2008 | Cheng | 720/647 |
| 7,770,191 B2 * | 8/2010 | Tamura | 720/647 |
| 7,886,316 B2 * | 2/2011 | Iwai et al. | 720/647 |
| 8,056,096 B2 * | 11/2011 | Lai et al. | 720/647 |
| 8,365,208 B2 * | 1/2013 | Qiu et al. | 720/647 |

\* cited by examiner

*Primary Examiner* — Mark Blouin
(74) *Attorney, Agent, or Firm* — Altis & Wispro Law Group, Inc.

(57) ABSTRACT

An electronic device comprises a main body and a limiting mechanism. At least one clasp is mounted on the inner surface of the main body. The limiting mechanism comprises a locking portion and a blocking portion. The at least one clasp is capable of being hooked to the opening and engaged with the locking portion to secure the limiting mechanism to the main body. The blocking portion abuts the at least one clasp for preventing the at least one clasp from disengaging from the locking portion after the at least one clasp is hooked to the locking portion.

19 Claims, 4 Drawing Sheets

ELECTRONIC DEVICE

BACKGROUND

1. Technical Field

The present disclosure relates to electronic devices.

2. Description of Related Art

Electronic devices, such as DVD players, include a main body, a cover rotatably secured to the main body, and a limiting mechanism for buffering the rotation of the cover. The main body includes a clasp perpendicularly set on the inner surface of the main body. The limiting mechanism is mounted on the inner surface of the main body via the clasp. However, the clasp is deformed to disengage with the limiting mechanism. As a result, the limiting mechanism is easily separated from the main body, and is unable to buffer the rotation of the cover.

Therefore, there is room for improvement in the art.

BRIEF DESCRIPTION OF THE FIGURE

The components of the drawings are not necessarily drawn to scale, the emphasis instead being placed upon clearly illustrating the principles of the embodiment of an electronic device. Moreover, in the drawings, like reference numerals designate corresponding parts throughout several views.

DETAILED DESCRIPTION

Embodiments of the present disclosure will be described with reference to the drawings.

Figure 1:
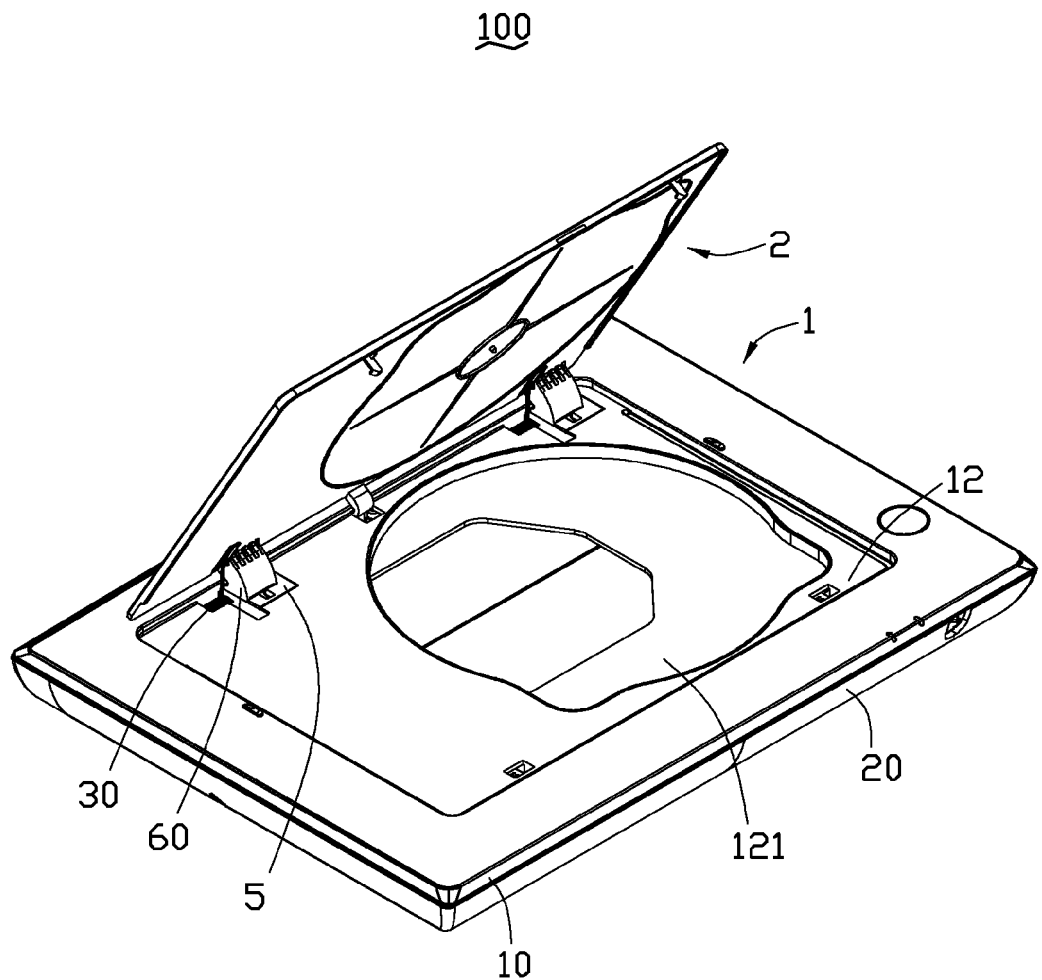
FIG. 1 is a schematic view of an electronic device, according to an embodiment.
Figure 2:
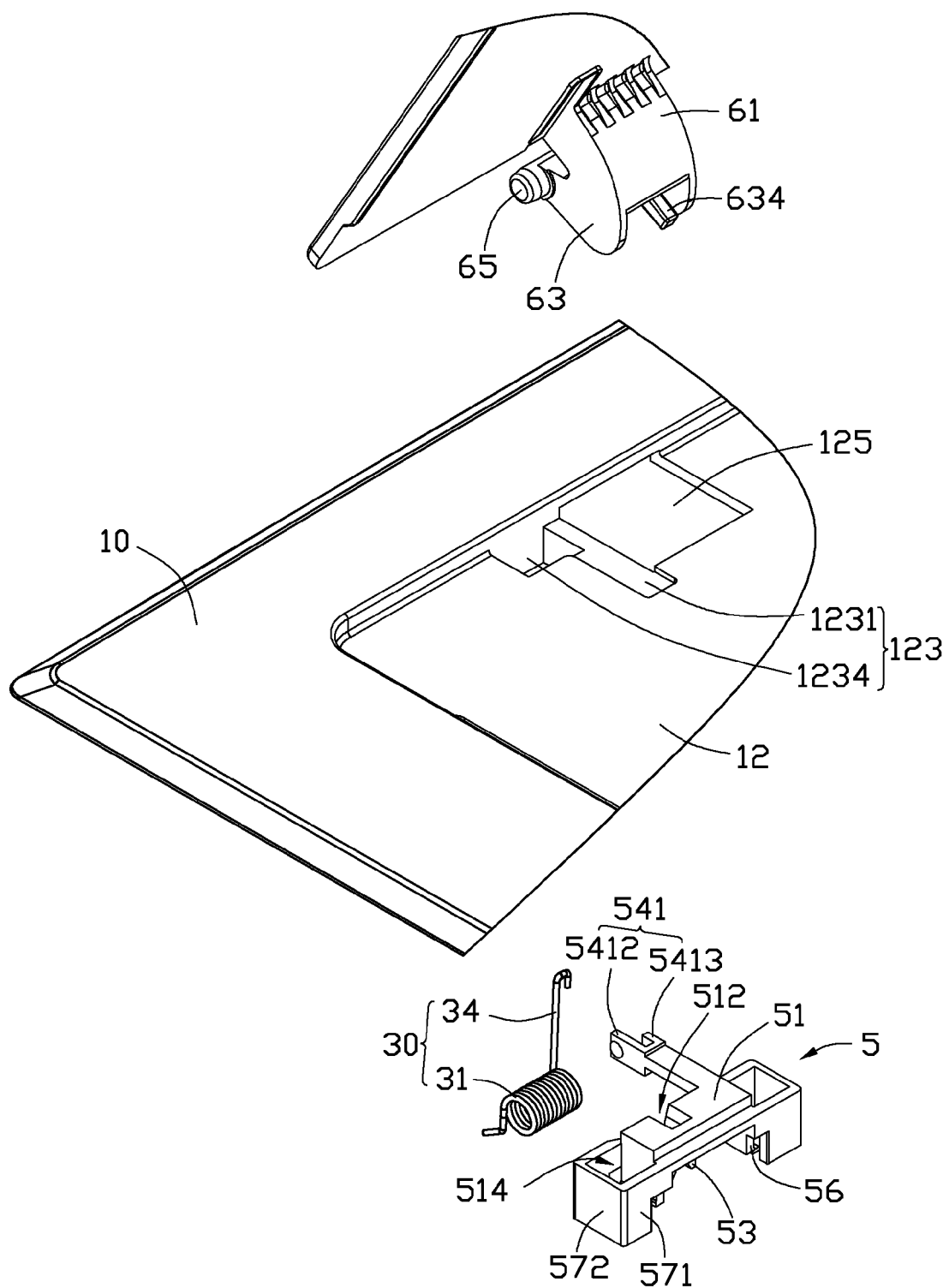
FIG. 2 is a partially enlarged and disassembled view of the electronic device without the bottom cover shown in FIG. 1.

Referring to FIG. 1, an electronic device 100 is shown. The electronic device 100 includes a main body 1, a flip cover 2 rotatably connected with the main body 1, and a limiting mechanism 5. The limiting mechanism 5 is used for buffering the rotation of the flip cover 2. In the embodiment, the electronic device 100 is a portable DVD player.

The main body 1 includes an upper cover 10, a bottom cover 20, and two elastic portions 30. The upper cover 10 cooperates with the bottom cover 20 to form a cavity (not labeled) for receiving the all the electronic components of the electronic device 100 (not shown).

Figure 3:
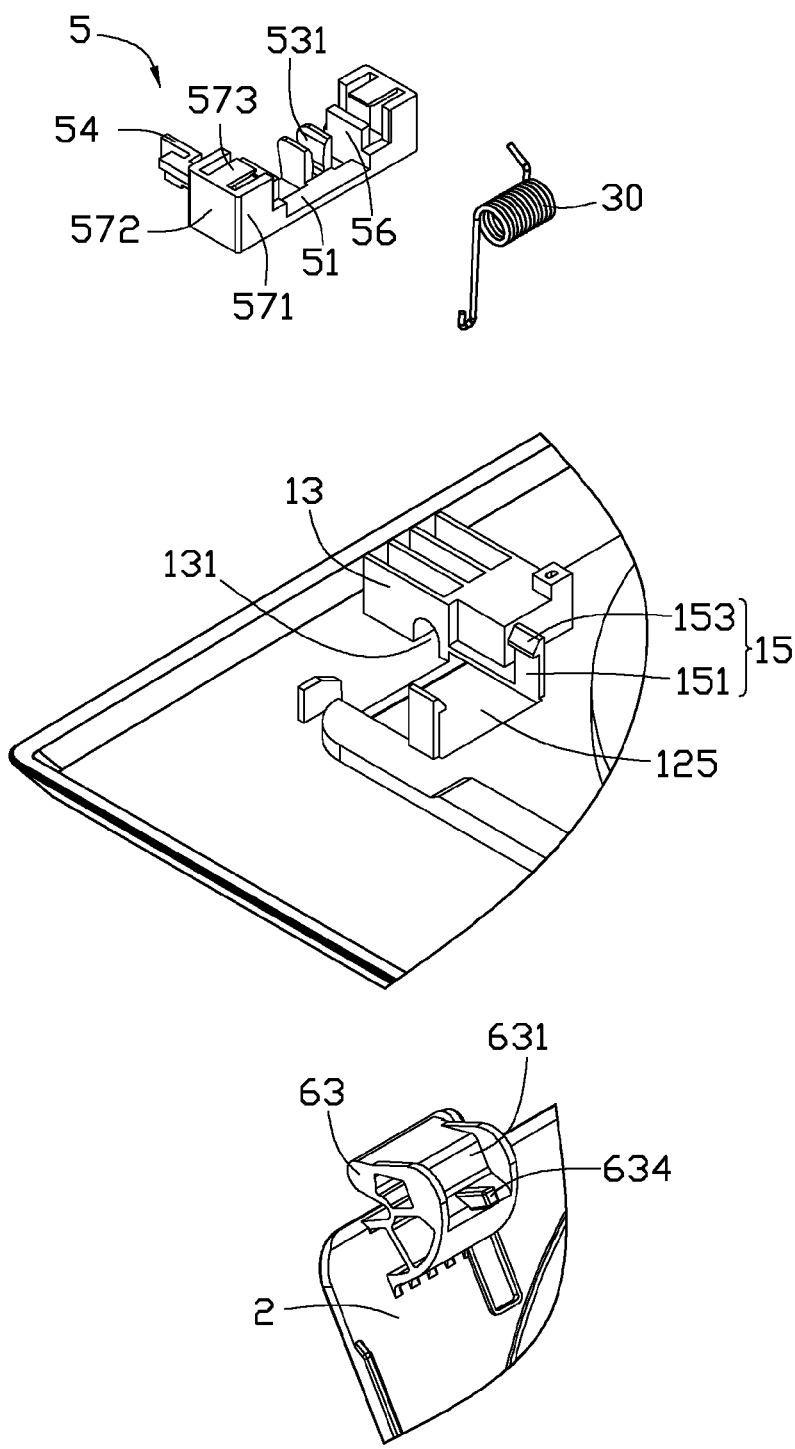
FIG. 3 is shows the FIG. 2 items, but viewed from another aspect.

Referring also to FIG. 3, the upper cover 10 is substantially rectangular. The upper cover 10 defines a recessed portion 12. The recessed portion 12 is concaved from an outer surface of the upper cover 10, and is used for receiving the flip cover 2. The recessed portion 12 is a substantially rectangular parallelepiped. The bottom of the recessed portion 12 defines a receiving groove 121, two receiving slots 123 and two through holes 125 respectively communicating with the receiving slots 123. The receiving groove 121 is substantially circular, and is used for receiving the disks (not shown). The receiving slots 123 and the through holes 125 are adjacent to an edge of the upper cover 10 where the flip cover 20 is rotatably connected. The receiving slot 123 is substantially L-shaped. Each of the receiving slots 123 includes a first slot 1231 and a second slot 1234 communicating with the first slot 1231. The first slot 1231 is substantially rectangular, and communicates with the through hole 125. The second receiving slot 1234 is substantially rectangular, and is spaced from the through hole 125. The depth of the second receiving slot 1234 relative to the bottom of the recessed portion 12 is larger than that of the first receiving slot 1231. The through hole 125 is substantially rectangular.

The upper cover 10 further includes two fixing portions 13 and four clasps 15 parallel with each other. The fixing portions 13 are perpendicularly arranged on an inner surface of the upper cover 10 opposite to the bottom cover 20 and respectively correspond to the through holes 125. Each of the fixing portions 13 defines a pivot hole 131. The axis of the pivot hole 131 is parallel with the edge of the through hole 125 extending in the lengthwise direction of the recessed portion 12.

The clasps 15 are secured to the inner surface of the main body 10 and are arranged at opposite sides of the through holes 125. Each of the clasps 15 includes a connecting plate 151 and a hook 153. The connecting plate 151 perpendicularly extends from the edge of the through holes 125. The hook 153 is arranged on an end of the connecting plate 151 away from the upper cover 10. The thickness of the connecting plate 151 is less than that of the hook 153. In the embodiment, the clasp 15 is made of elastic material.

The elastic portions 30 are received in the receiving slots 123. Each of the elastic portions 30 includes an elastic body 31 and an elastic arm 34. The elastic body 31 is received in and held in the second slot 1234, and the elastic arm 34 is received in the first slot 1231. In the embodiment, the elastic portion 30 is a torsion spring.

The limiting mechanism 5 includes a base 51, a buffering portion 53, a resisting portion 54, two locking portions 56, and two blocking portions 57. The buffering portion 53, the blocking portions 56, and the blocking portions 57 are perpendicular to the base 51 and parallel with each other. The base 51 is substantially rectangular. The base 51 defines a gap 512 and two openings 514. The gap 512 is set on the center of the base 51, and is substantially U-shaped. The two openings 514 are set on opposite ends of the base 51, and are substantially rectangular.

The buffering portion 53 includes two buffering plates 531. The two buffering plates 531 perpendicularly extend from opposite edges of the gap 512. The opposite surfaces of the two buffering plates 531 which face each other are substantially arcuate. The distance between opposite ends of the buffering plates 531 furthest away from the base 51 is greater than the distance between opposite ends of the buffering plates 531 adjacent to the base 51.

The resisting portion 54 perpendicular to the buffering portion 53 extends from an edge of the base 51. A positioning end 541 is perpendicularly arranged at an end of the resisting portion 54 away from the base 51. The positioning end 541 includes a first arm 5412 and a second arm 5413. Both of the first arm 5142 and the second arm 5413 are perpendicular to the base 51. The first arm 5142 is longer than the second arm 5413. In the embodiment, the resisting portion 54 blocks the limiting mechanism 3 from falling into the through hole 125 during the assembling operation.

The locking portions 56 extend from an edge of the openings 514 adjacent to the buffering portion 53. The locking portion 56 is substantially rectangular.

The blocking portions 57 are perpendicularly arranged at opposite ends of the base 51 and are connected with an edge of the opening 514 away from the locking portion 56. Each of the blocking portions 57 includes two first plates 571 parallel with each other, a second plate 572, and an elastic plate 573. The first plates 571 and the second plate 572 perpendicularly extend from edges of the opening 514 away from the locking portion 56. The first plates 571 are substantially L-shaped and perpendicularly connect with opposite edges of the locking portion 56. The second plate 572 is substantially rectangular and perpendicularly connects to the ends of the first plates 571 furthest away from locking portion 56. The elastic plate 573 is parallel with the base 51 and is arranged between the two first plates 571. The elastic plate 573 is a predetermined distance from the first plates 571 and perpendicularly connects with second plate 572. The distance between the elastic plate 573 and the base 51 is less than the distance between the hook 153 and the upper cover 10, but is larger than the height of the locking portion 56 relative to the base 51. In the embodiment, the first plates 571 and the second plates 572 enhance the stiffness of the elastic plate 573, and the distance between the elastic plate 573 and the locking portion 56 is equal to the thickness of the connecting plate 151.

The flip cover 2 is substantially rectangular and is capable of being received in the recessed portion 12. The flip cover 2 includes two rotating members 60. The rotating members 60 are perpendicularly arranged on the surface of the flip cover 2 facing the main body 1, and correspond to the through holes 125. Each of the rotating members 60 includes a securing portion 61, a bent portion 63, and a pivot 65. The securing portion 61 is arranged on an edge of the flip cover 2 where the flip cover 2 rotatably connected with the main body 1. The securing portion 61 perpendicularly protrudes from an inner surface of the flip cover 2 towards the main body 1.

The bent portion 63 bends from an end of the securing portion 61 towards the flip cover 2. The bent portion 63 protrudes out of an edge of the flip cover 2 rotatably connected with the main body 1. The end of the bent portion 63 connecting with the securing portion 61 defines a groove 631 (see FIG. 4). The bent portion 63 further includes an operating portion 634. The operating portion 634 perpendicularly protrudes from the bottom surface of the groove 631, and engages with the buffering portion 53 for buffering the rotating of the flip cover 2. The operating portion 634 is substantially wedge shaped. The thickness of an end of the operating portion 634 away from the groove 631 is equal to the distance between opposite ends of the buffering plate 531 adjacent to the base 51.

The pivot 65 is set on the end of the bent portion 63 furthest from the securing portion 61. The pivot 65 is rotatably received in the pivot hole 131.

Figure 4:
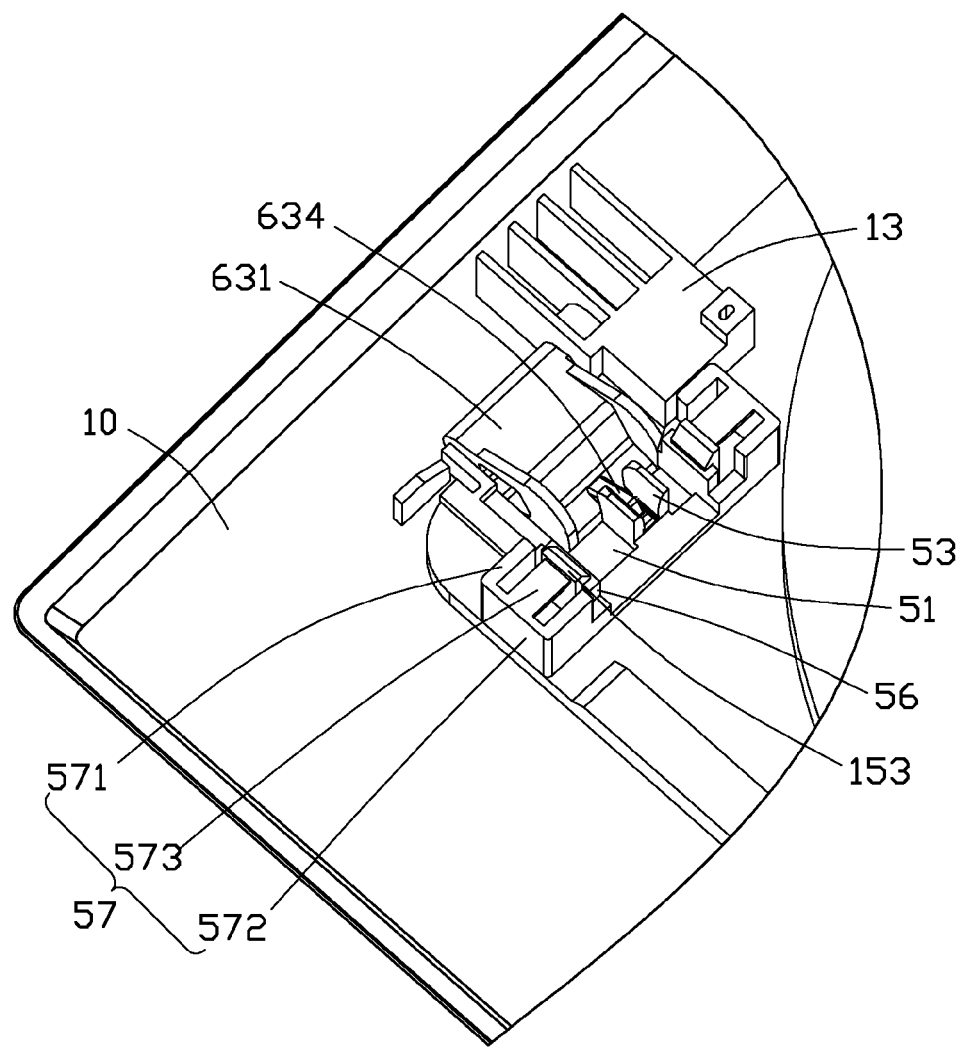
FIG. 4 is a partially assembly view of the electronic device of FIG. 3.

Referring to FIG. 4, in assembly, when the clasp 15 is inserted into opening 514 of the limiting mechanism 3, the elastic plate 573 is deformed by the inserted hook 153 so as to allow the clasp 15 to extend through the opening 514. When the hook 153 is hooked to an end of the locking portion 56 away from the base 51, the elastic plate 573 resumes the original position to abut the connecting plate 151, such that the connecting plate 151 is sandwiched between the locking portion 56 and the blocking portion 57 for preventing the clasp 15 from disengaging with the locking portion 56. The buffering portion 53 faces the through hole 125. The pivot 65 is received in the pivot hole 131. The flip cover 2 is secured to the main body 1 by the pivots 65 being received in the pivot holes 131, with the operating portion 634 corresponding to the buffering portion 53.

After assembly, when electronic device 100 is closed, the flip cover 2 covers the main body 1. The elastic portion 30 is compressed and the operating portion 634 is away from the buffering portion 53. When the electronic device 100 is open, the elastic arm 34 is rotated out of the first slot 1231, and the elastic body 31 is rotated in the second slot 1234, thus the elastic portion 30 is released for lifting up the flip cover 2 from the main body 1. At the same time, the operating portion 634 is inserted into the buffering portion 53 for slowing down the rotation of the flip cover 2. The flip cover 2 is stopped when the operating portion 634 makes contact with the base 51.

While various exemplary and preferred embodiments have been described, the disclosure is not limited thereto. On the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. An electronic device, comprising:
   a main body;
   a limiting mechanism detachably secured to the main body, the limiting mechanism comprising a locking portion and a blocking portion; and
   at least one clasp mounted on the inner surface of the main body;
   wherein the at least one clasp is capable of being hooked to the locking portion to secure the limiting mechanism to the main body and being sandwiched between the locking portion and the blocking portion; the blocking portion resists the at least one clasp for preventing the at least one clasp disengaging from the locking portion after the at least one clasp is hooked with the locking portion.

2. The electronic device of claim 1, wherein the blocking portion comprises a First plate parallel with the locking portion and an elastic plate set between the first plate and the locking portion; the elastic plate perpendicularly extends from an end of the first plate away from the main body and spaced from the locking portion.

3. The electronic device of claim 2, wherein the at least one clasp comprises a connecting plate and a hook; the hook is perpendicularly arranged on an end of the connecting plate away from the main body; the distance between the elastic plate and the locking portion is equal to the thickness of the connecting plate, and is less than the thickness of the hook.

4. The electronic device of claim 3, wherein the distance between the elastic plate and the base is less than the height of the at least one clasp relative to the main body, and is larger than the height of the locking portion relative to the base.

5. The electronic device of claim 3, wherein the at least one clasp and the elastic plate is made of elastic material.

6. The electronic device of claim 2, wherein the blocking portion further comprises two second plates parallel with each other; the second plates respectively perpendicularly extends from opposite edges of the first plate and connects with the locking portion.

7. The electronic device of claim 6, wherein the elastic plate is spaced from the second plates in a predetermined distance.

8. The electronic device of claim 2, wherein the limiting mechanism further comprises a base with an opening; the opening is arranged at the end of the base for allowing the at least one clasp to be inserted into the limiting mechanism; the locking portion and the first plate are perpendicularly arranged on opposite edges of the opening.

9. The electronic device of claim 8, wherein the electronic device further comprises a flip cover rotatably connected with the main body; the limiting mechanism further comprises a buffering portion parallel with the locking portion; the buffering portion perpendicular to the base is used for buffering the rotation of the flip cover.

10. The electronic device of claim 9, wherein the base defines a gap away from the locking portion and the blocking portion; the buffering portion comprises two buffering plates parallel with each other; the buffering plates perpendicularly extends from opposite edges of the gap.

11. The electronic device of claim 10, wherein the gap is substantially U-shaped.

12. The electronic device of claim 10, wherein the opposite surfaces of the two buffering plates are substantially arcuate; the distance between opposite ends of the buffering plates away from the base is greater than that of opposite ends of the buffering plates adjacent to the base.

13. The electronic device of claim 9, wherein the main body defines a through hole; the flip cover comprises an operating portion; the operating portion is capable of engaging with the buffering portion via the through hole.

14. The electronic device of claim 13, wherein the at least one clasp is perpendicularly extended from an edge of the through hole.

15. An electronic device, comprising:
a main body;
a limiting mechanism detachably secured to the main body, the limiting mechanism comprising a locking portion and a blocking portion; and
at least one clasp mounted on the inner surface of the main body;
wherein the blocking portion comprises a first plate parallel with the locking portion and an elastic plate; the elastic plate perpendicularly extends from an end of the first plate away from the main body; the elastic plate is deformed while the at least one clasp inserts the limiting mechanism and then resumes the original position to resist the at least one clasp for keeping the at least one clasp hooked with the locking portion.

16. The electronic device of claim 15, wherein the blocking portion further comprises two second plates parallel with each other; the second plates respectively perpendicularly extends from opposite edges of the first plate and connects with the locking portion.

17. The electronic device of claim 15, wherein the electronic device further comprises a flip cover with an operating portion; the limiting mechanism further comprises a buffering portion parallel with the locking portion; the operating portion is capable of engaging with the buffering portion for buffering the rotation of the flip cover.

18. The electronic device of claim 17, wherein the buffering portion comprises two buffering plates parallel with each other; the operation portion is sandwiched between the two buffering plates.

19. The electronic device of claim 18, wherein the opposite surfaces of the two buffering plates are substantially arcuate; the distance between opposite ends of the buffering plates away from the base is greater than that of opposite ends of the buffering plates adjacent to the base.

* * * * *